United States Patent
Sahota et al.

[11] Patent Number: 6,124,640
[45] Date of Patent: Sep. 26, 2000

[54] SCALABLE AND RELIABLE INTEGRATED CIRCUIT INTER-LEVEL DIELECTRIC

[75] Inventors: Kashmir Sahota, Fremont; Richard J. Huang, Cupertino; Hung-Sheng Chen, San Jose; Yu Sun, Saratoga, all of Calif.

[73] Assignee: Advanced Micro Devices, Inc., Sunnyvale, Calif.

[21] Appl. No.: 09/144,506

[22] Filed: Aug. 31, 1998

[51] Int. Cl.⁷ .................................................. H01L 51/00

[52] U.S. Cl. .................... 257/758; 257/759; 257/760; 257/775; 257/748; 257/730; 257/752

[58] Field of Search ................................. 257/759, 760, 257/758, 776, 775, 748, 752, 730

[56] References Cited

U.S. PATENT DOCUMENTS

| | | | |
|---|---|---|---|
| 5,407,860 | 4/1995 | Stoltz et al. | 257/522 |
| 5,470,802 | 11/1995 | Gnade et al. | 438/781 |
| 5,486,493 | 1/1996 | Jeng | 257/522 |
| 5,512,775 | 4/1996 | Cho | 257/522 |
| 5,661,344 | 8/1997 | Havemans et al. | 257/642 |
| 5,747,880 | 5/1998 | Havemann et al. | 257/760 |
| 5,818,111 | 10/1998 | Jeng et al. | 257/758 |

*Primary Examiner*—Fetsum Abraham

[57] ABSTRACT

An inter-level dielectric (ILD) is formed from a lower barrier layer comprising a conformal silicon oxynitride layer, a gap fill layer comprising a high-density plasma (HDP) oxide and a cap layer. The use of HDP oxide as a gap fill layer enables better control of the ILD thickness, avoids outgasing problems, facilitates via formation and reduces planarization.

14 Claims, 5 Drawing Sheets

SCALABLE AND RELIABLE INTEGRATED CIRCUIT INTER-LEVEL DIELECTRIC

RELATED APPLICATION

This application contains subject matter related to subject matter disclosed in U.S. patent application Ser. No. 09/144,694 entitled "SCALABLE AND RELIABLE INTEGRATED CIRCUIT INTER-LEVEL DIELECTRIC" and filed on Aug. 31, 1998, [Attorney Docket No. 50100-521 (1033-453).

FIELD OF THE INVENTION

The present invention relates to semiconductor devices and, more specifically, to a scalable and reliable inter-level dielectric for integrated circuits.

BACKGROUND OF THE INVENTION

Integrated circuits are typically fabricated from one or more layers of different materials. Typical integrated circuits include multiple interconnected patterned metal layers, with intervening inter-level dielectric (ILD) layers to electrically insulate the metal layers.

The selection of a specific ILD depends upon the performance, density and reliability requirements of a particular semiconductor circuit. Ideal ILDs are contamination and defect free, exhibit a low dielectric constant that approaches unity, have a sufficiently high field strength, provide a good barrier to sodium ions (Na+) and provide infinite etch selectivity to underlying materials, such as silicides, silicon and polysilicon. ILDs must also conform to different topographies, such as steps and gaps, exhibit good adhesion to the underlying and overlying layers and be capable of planarization.

Good ILD planarization characteristics become increasingly important as the number of layers in a device increases because photolithography processes are acutely sensitive to variations in ILD topography, particularly in patterning vias. However, in fabricating ultra high density semiconductor devices, which include tightly packed, high aspect ratio metal patterns, it can be difficult to satisfactorily planarize a deposited dielectric material, particularly when the dielectric material is deposited globally on both relatively dense areas containing a relatively large number of circuit components and other areas such as peripheral circuitry regions that contain relatively few circuit components.

A prior conventional approach to forming ILDs involves depositing two dielectric layers. First, a first gap filling layer, e.g., spin-on-glass (SOG), silicon dioxide ($SiO_2$), or other oxide, is deposited on a patterned metal layer to fill any gaps therein. Typical gap fill layers not only fill gaps but also deposit on the upper surface of underlying patterned metal feature. Then a second dielectric layer, referred to as a "cap layer," is deposited on the gap fill layer. The cap layer is then planarized (leveled), as by a chemical-mechanical polishing (CMP), to provide a substantially flat upper surface on which additional layers are formed. Such a technique is illustrated in FIGS. 1A through 1C.

Referring to FIG. 1A, a conventional integrated circuit structure is designated by the reference numeral 100. A dielectric layer 102, typically, silicon dioxide ($SiO)_2$, is formed on a substrate 104, typically doped monocrystalline silicon (Si). A patterned metal layer comprising one or more metal features or "stacks" 105 with gaps therebetween, is formed on dielectric layer 102. Conventional metal stacks 105 comprise a lower barrier layer 106, typically titanium (Ti), an intermediate primary conductive layer 108, typically aluminum (Al), on barrier layer 106, and an upper anti-reflective coating (ARC) 110, typically titanium-nitride (TiN), on conductive layer 108. Barrier layer 106 and ARC 110 tend to reduce electromigration in conductive layer 108, albeit at the cost of increasing sheet resistance. The total height of metal stacks 105 varies depending upon the particular application, but is typically about one micron.

Once metal stacks 105 have been formed, a dielectric gap fill layer 112, such as $SiO_2$, is deposited on dielectric layer 102 and ARC 110, to insulate metal stacks 105 from each other. Gap fill layer 112 characteristically forms peaks 114 on top of metal stacks 105 whose height 115, 116 above the upper surface of ARC 110 varies depending upon both the width of metal stacks 105 and the particular gap fill material and deposition process.

As illustrated in FIG. 1B, a dielectric cap layer 118, such as $SiO_2$, is deposited on gap fill layer 112. Dielectric cap layer 118 may be the same material as gap fill layer 112, or may be a different material. Cap layer 118 typically has a thickness of about 1.2 to about 1.8 microns. The upper surface 120 of dielectric cap layer 118 is not flat, but generally conforms to the shape of gap fill layer 112. As illustrated in FIG. 1C, dielectric cap layer 118 is then planarized as by CMP, so its upper surface 120 is substantially flat. During conventional planarization of cap layer 118 about 0.2 to about 0.8 microns of dielectric material must be removed to achieve adequate planarity, leaving a cap layer 118 having a thickness of about one micron. Thus, gap fill layer 112 and cap layer 118 form an ILD 122 having a substantially flat upper surface 120 upon which additional integrated circuit layers may be formed.

The conventional methodology illustrated in FIGS. 1A–1C suffers from drawbacks, particularly as miniaturization drives design features in to the deep sub-micron range, e.g., about 0.18 $\mu$ and under. Specifically, it is sometimes difficult to obtain a substantially flat upper ILD surface using conventional CMP when the underlying topography contains relatively large steps and height variations. Conventional practices remove a predetermined amount of material which is estimated to be sufficient to provide a substantially flat planar upper ILD surface. However, this often requires deposition of a relatively thick cap layer 118, thereby undesirably increasing material processing costs.

More importantly, conventional ILD structures, such as the ILD structure 100 illustrated in FIGS. 1A–1C, often suffer from poor immunity to hot carrier injection (HCI) reliability failures. It is recognized that HCI problems typically arise when semiconductor device dimensions are reduced while maintaining the supply voltage at the same level, thereby increasing the electric field generated in the silicon substrate, and consequently sufficiently energizing electrons in the channel so that they are injected into the gate oxide, thereby changing the gate oxide, causing long term device degradation by causing the threshold voltage of the device and reducing its transconductance.

Another problem attendant upon conventional practices stems from the permeation of hydrogen atoms from gap fill layer 112 through dielectric layer 102, adversely affecting underlying devices, particularly when employing hydrogen silsesquioxane (HSQ) as the material for the gap fill layer.

Accordingly, there is a need for integrated circuits having ILDs that avoid the problems and limitations of prior approaches. There is a particular need for integrated circuits having ILDs that can be planarized to provide a substantially flat upper surface while eliminating a substantially preventing hot carrier degradation.

SUMMARY OF THE INVENTION

An advantage of the invention is a semiconductor device having an ILD that can be planarized to provide a substantially flat upper surface and resistance to hot carrier degradation.

Another advantage of the present invention is a method of manufacturing a semiconductor device with a substantially flat upper surface and resistance to hot carrier degradation.

Additional advantages and other features of the present invention will be set forth in part in the description which follows and in part will become apparent to those having ordinary skill in the art upon examination of the following or may be learned from the practice of the invention. These and other advantages of the invention may be realized and obtained as particularly pointed out in the appended claims.

According to an aspect of the invention, the foregoing and other advantages are achieved in part by a semiconductor device comprising a substrate, a first dielectric layer formed on the substrate, a patterned metal layer having one or more gaps formed on the first dielectric layer, a conformal barrier layer formed on and at least substantially covering the patterned metal layer, a second dielectric layer formed on the lower barrier layer and a third planarized dielectric layer formed on the second dielectric layer.

According to another aspect of the invention, the lower barrier layer comprises silicon oxynitride (SION) which enhances planarization and improves resistance to HCI effects.

Another aspect of the present invention is a method of manufacturing a semiconductor device. The method comprises forming a first dielectric layer on a substrate, forming a patterned metal layer on the first dielectric layer, wherein the patterned metal layer includes one or more gaps, forming a conformal barrier layer on the patterned metal layer, forming a second dielectric layer on the conformal barrier layer and forming a third dielectric layer on the second dielectric layer.

Additional advantages of the present invention will become readily apparent to those skilled in the art from the following detailed description, wherein only the preferred embodiment of the present invention is shown and described, simply by way of illustration of the best mode contemplated for carrying out the invention. The invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Embodiments of the present invention are illustrated by way of example, and not by way of limitation, in the figures of the accompanying drawings in which like reference numerals refer to similar elements and in which.

DETAILED DESCRIPTION OF THE PREFERRED EMBODIMENT

In accordance with the invention, an ILD for an integrated circuit is formed from a conformal barrier layer comprising SiON, a dielectric gap fill layer comprising a high-density plasma (HDP) oxide layer and a dielectric cap layer. After forming a patterned metal layer on a dielectric layer, the SiON layer is deposited on both the patterned metal layer and the dielectric layer. According to an embodiment of the invention, the SiON layer is made relatively thin compared to the patterned metal layer so that the SiON layer generally conforms to the shape of the patterned metal layer. The HDP oxide layer is then deposited on the SiON layer. The cap layer is then deposited on the HDP oxide layer and planarized to form an ILD of desired thickness. The invention enables formation of an ILD with a substantially planar upper surface, thereby facilitating photolithographic processing with high accuracy. In addition the ILD exhibits enhanced resistance to HCI degradation relative to conventional ILDs.

Figure 1A:
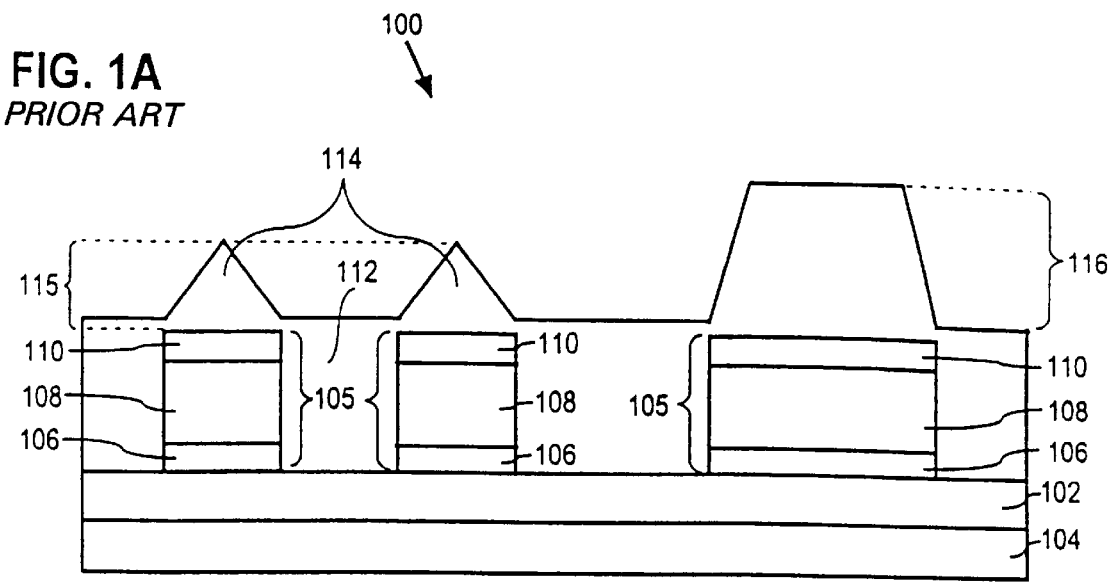
FIGS. 1A, 1B and 1C illustrate processing steps for manufacturing an integrated circuit with an ILD using conventional semiconductor fabrication techniques.
Figure 1B:
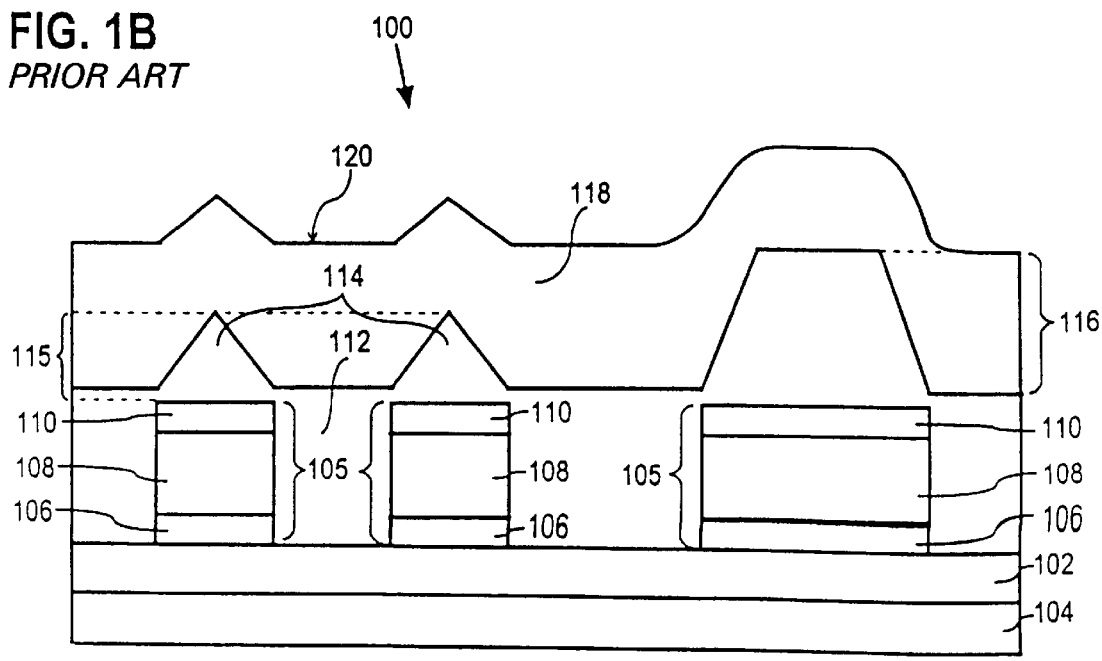
Figure 1C:
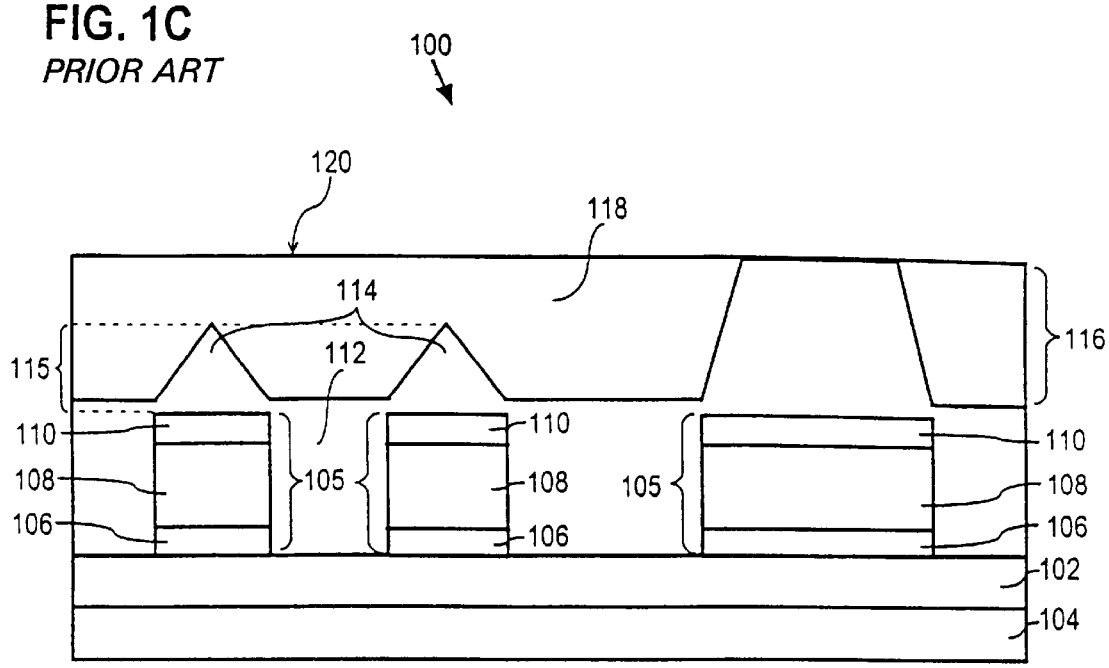
Figure 2:
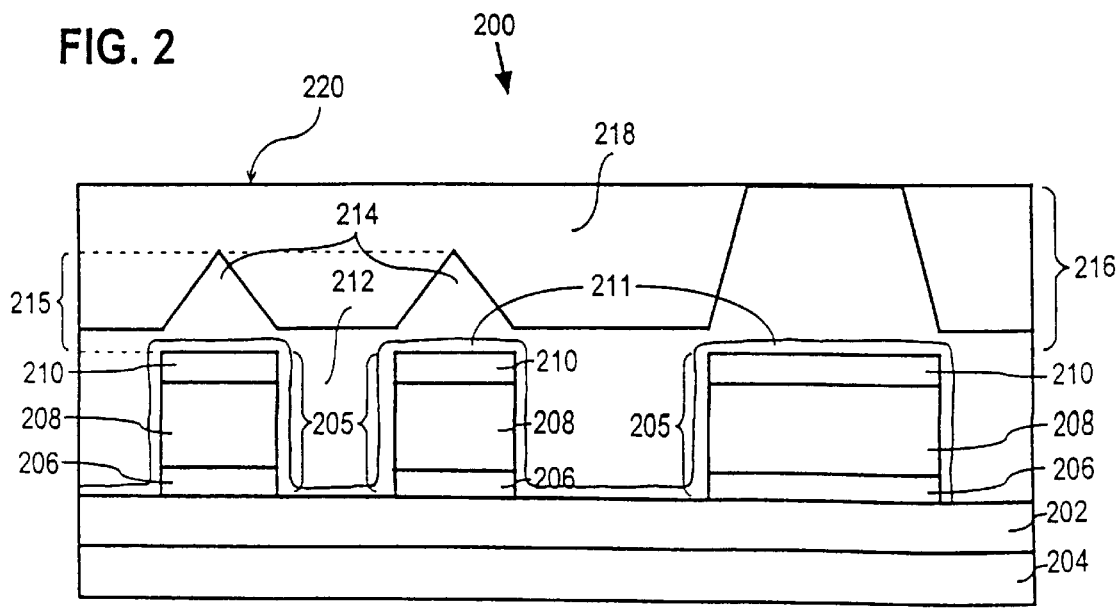
FIG. 2 schematically illustrates an integrated circuit with an ILD formed in accordance with an embodiment of the present invention.

FIG. 2 schematically illustrates a semiconductor circuit 200 having an ILD formed in accordance with an embodiment of the invention. Semiconductor circuit 200 includes a dielectric layer 202 formed on a substrate 204. A patterned metal layer comprising one or more metal features or stacks 205 is formed on dielectric layer 202. Metal stacks 205 include a barrier layer 206, typically of Ti or Tungsten (W), an intermediate primary conductive layer 208, typically Al, and an ARC 210, typically Ti/TiN. Metal stacks 205 are typically patterned to form metal lines.

In accordance with the invention, a conformal barrier layer 211 comprising SiON is deposited on and substantially covering metal stacks 205 and dielectric layer 202. SiON layer 211 can be selectively deposited to cover particular portions of metal stacks 205 and dielectric layer 202, or can be globally deposited to completely cover metal stacks 205 and dielectric layer 202. In addition, as illustrated on FIG. 2, the thickness of SiON layer 211 can be thinner than metal stacks 205 and dielectric layer 202. Thus, SiON layer 211 includes gaps in between metal stacks 205. Alternatively, SiON layer 211 can be made thicker to partially or completely fill the gaps between metal stacks 205. The SiON layer 211 can be represented by the formula $SiO_xN_y$, where the values for x and y are optimized, e.g., $SiO_3N_4$. The SiON layer may also be capable of transmitting ultra violet light, as for memory applications.

Circuit 200 includes a dielectric gap fill layer 212 comprising a HDP oxide layer formed on dielectric layer 202 and ARC 210. HDP oxide layer 212 characteristically forms peaks 214 on top of metal stacks 205 that have heights 215, 216 that vary according to the particular deposition process. According to another embodiment of the invention, deposition conditions are controlled to from peaks 214 of reduced sharpness and relatively round shape.

The thickness of HDP oxide layer 212 on top of metal stacks 205 generally depends upon the size of metal stacks 205. For example, for relatively wide metal structures, gap fill layer 212 has a thickness 216 of about 5000 Å to about 7000 Å. On the other hand, for relatively small metal features, such as thin metal lines, the thickness 215 of gap fill layer 212 on top of metal stacks 205 is about 3500 Å to about 5000 Å.

Circuit 200 also includes a dielectric cap layer 218 formed on gap fill layer 212. Cap layer 218 can be the same dielectric material as HDP oxide layer 212 or can be a different material. After deposition, cap layer 218 generally conforms to the shape of HDP oxide layer 212. Cap layer 218 is then planarized, as by CMP, to provide a substantially flat and upper surface 220.

SiON layer 211 reduces the migration of electrical carriers from HDP oxide layer 212 into underlying layers, thereby increasing the resistance of circuit 200 to HCI reliability failures.

Figure 3A:
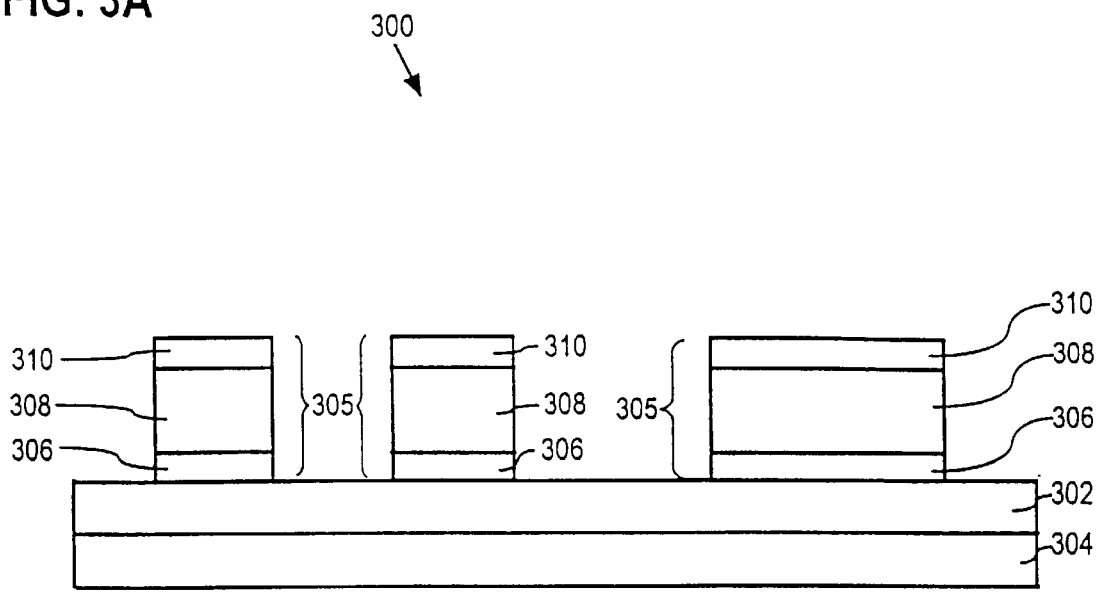
FIGS. 3A–3E illustrate relevant processing steps for manufacturing an integrated circuit with an ILD in accordance with an embodiment of the present invention.

Sequential processing steps for forming circuit 200 according to an embodiment of the invention are described with reference to FIGS. 3A–3E. Referring to FIG. 3A, metal stacks 305, having a height of about 1 micron, are formed on dielectric layer 302 which, in turn, is formed on substrate 304. Metal stacks 305 comprise a barrier layer 306, typically Ti deposited at a thickness of about 250 to about 500 Å, as by conventional physical vapor deposition (PVD) or chemical vapor deposition (CVD), an intermediate metal layer 308, typically Al deposited by a conventional deposition technique at a thickness of about 6000 Å to about 10000 Å, and ARC 310, typically a Ti/TiN composite layer having a thickness in the range of about 1000 to about 1500 Å.

Figure 3B:
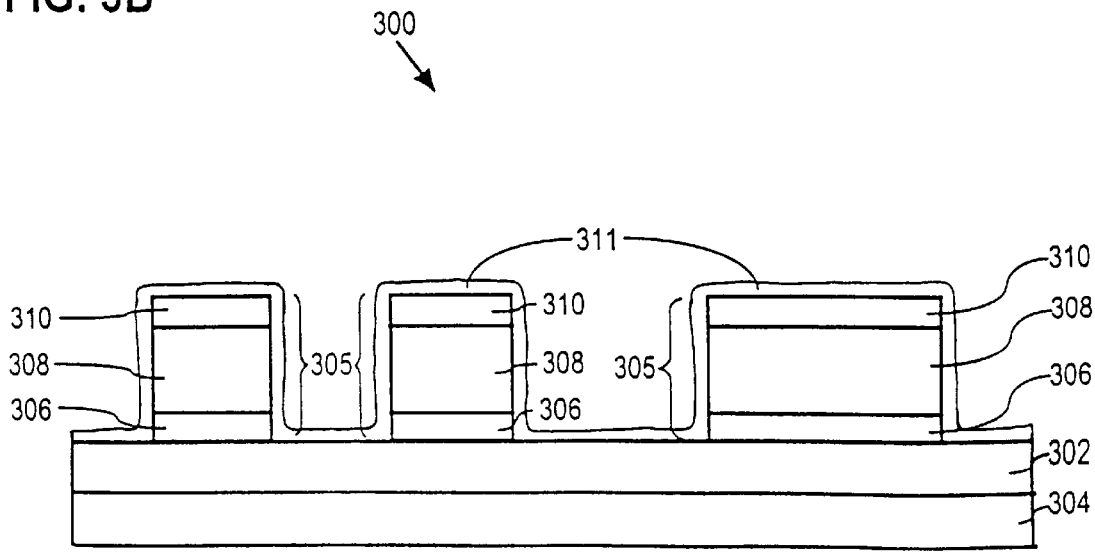

As illustrated in FIG. 3B, a SiON layer 311 is deposited on and substantially covering both metal stacks 305 and dielectric layer 302. According to one embodiment of the invention, the thickness of SiON layer 311 is about 500 to about 3000 Å, e.g., SiON layer 311 has a thickness of about 750 to about 2000 Å.

Figure 3C:
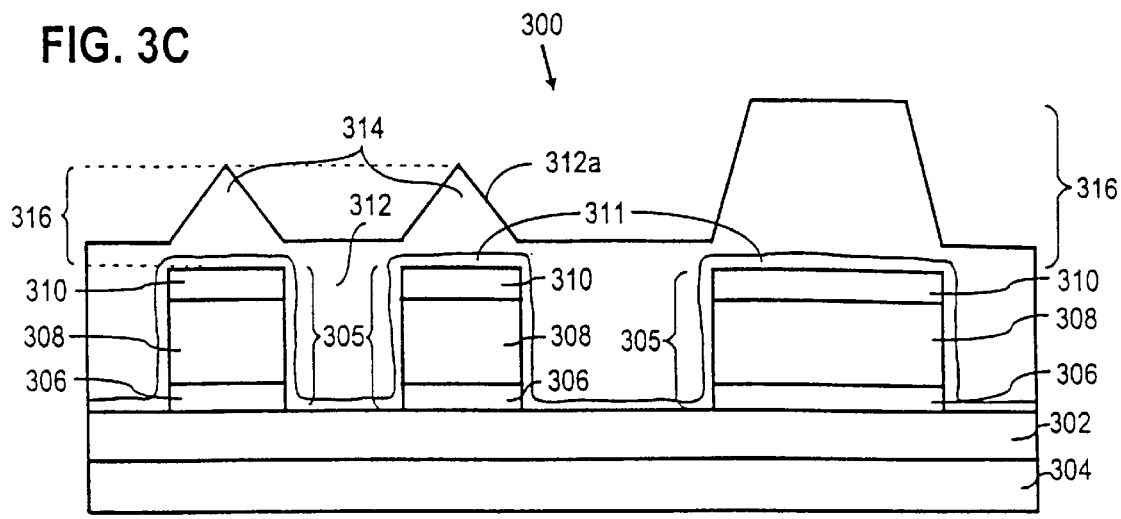

As illustrated in FIG. 3C, an HDP oxide layer 312 is deposited on and substantially covering SiON layer 311. The top surface 312a of HDP oxide layer 312 is characteristically non-uniform and contains peaks 314 above metal stacks 305. The height 316 of HDP oxide layer 312 above metal stacks 305 varies depending upon both the width of metal stacks 305 and the particular material and deposition process. According to an embodiment of the invention, HDP oxide layer 312 has a thickness of about 3500 to about 5000 Å for relatively narrow structures and about 5000 to about 7000 Å for relatively wide structures, such as wide metal lines.

Figure 3D:
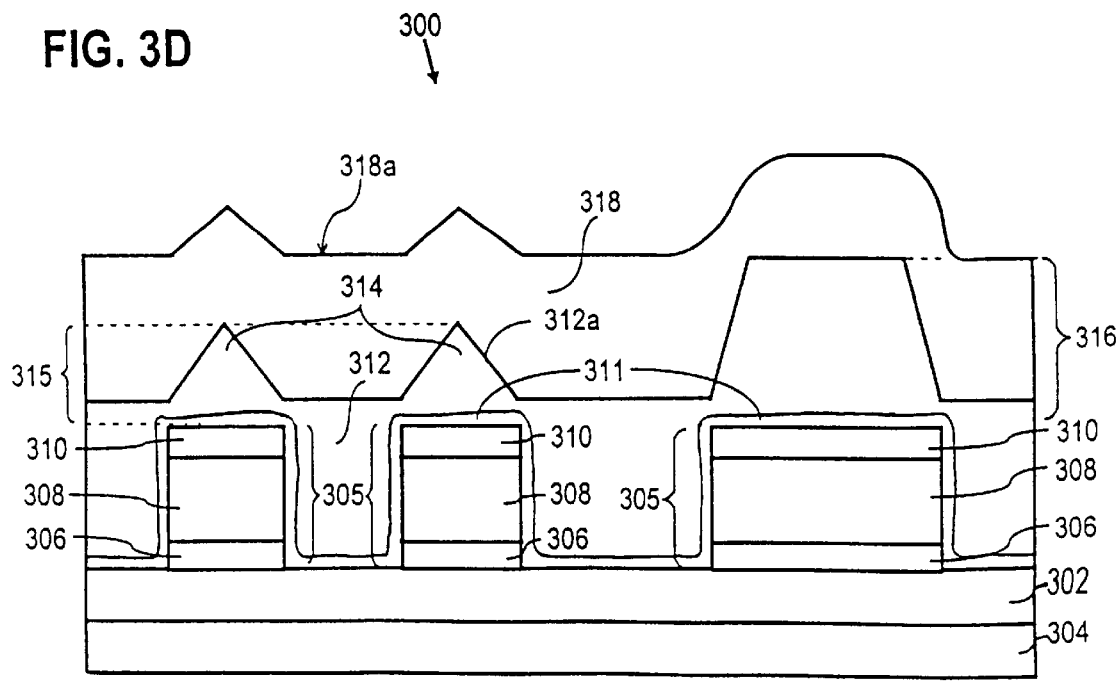
Figure 3E:
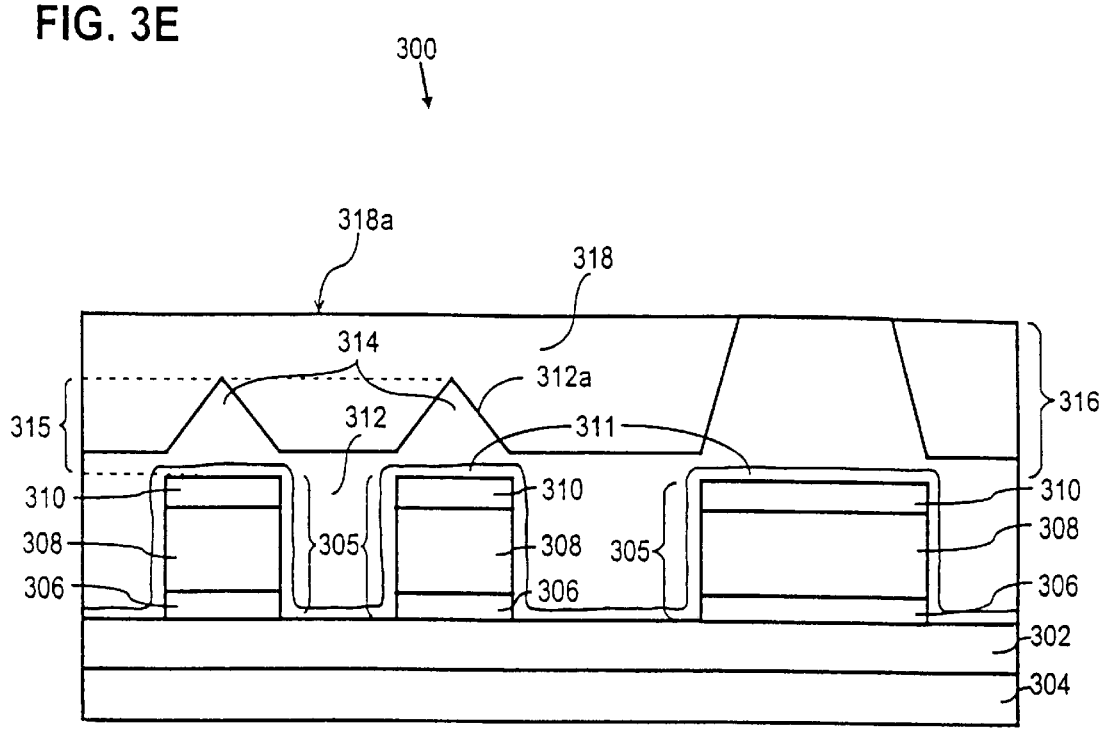

Referring to FIG. 3D, a dielectric cap layer 318, having a thickness of about one micron, is deposited on HDP oxide layer 312 using conventional deposition techniques. Materials found to be suitable for cap layer 318 include a silicone oxide derived from tetraethyl orthosilicate (TEOS). According to an embodiment of the invention, the thickness of cap layer 318 is about 12,000 to about 20,000 Å. Since the upper surface 318a generally conforms to upper surface 312a of HDP oxide layer 312 and contains uneven topography, it is generally unsuitable for forming additional layers thereon. Accordingly, as illustrated in FIG. 3E, cap layer 318 is planarized using conventional techniques, such as CMP. Conventional CMP provides an upper surface 318a that is substantially, e.g., exhibits a peak surface planarity of less than about 2000 Å.

The use of HDP oxide layer 312 as a gap fill layer provides relatively greater flexibility than conventional gap fill layer materials. For example, the amount of material removed during CMP of cap layer 318 can be selected so that HDP oxide layer 312 remains completely covered by cap layer 318. Alternatively, portions of cap layer 318 may be completely removed to expose HDP oxide layer 312. This cannot be done with other types of gap fill material, such as HSQ, since HSQ typically will outgas. Thus, HDP oxide layer 312 enable formation of cap layer 318 a reduced thickness, thereby reducing manufacturing costs and increasing throughput.

Embodiments of the invention have been described (and illustrated) in the context of a single ILD. However, embodiments of the invention are applicable to semiconductor devices having any number of ILDs, e.g., six layers, where not every metal layer includes a SiON layer.

The invention is applicable to the manufacture of various types of semiconductor devices, particularly ultra high density devices with sub-micron features, e.g., 0.18 microns and under. The invention provides several technological advantages over prior integrated circuit ILDs. Embodiments of the invention provide ILDs with improved surface planarity than conventional practices, thereby enhancing photolithographic accuracy in defining sub-micron design features. In addition, the use of HDP oxide layer 312 enables better control over the total thickness of ILDs. Moreover, barrier layers 211 and 311 reduce HCI degradation compared to conventional ILDs. Thus, semiconductor device having an ILD in accordance with embodiments of the invention exhibit greater resilience to HCI reliability failures. In addition, the use of HDP oxide layer 312 reduces via "poisoning", because the sidewalls of vias formed in HDP oxide layer 312 do not have to be sealed off before filling the vias with a conductive material, such as tungsten.

In the previous description, specific details have been set forth, such as specific materials, structures, chemicals, processes, etc., in order to provide a thorough understanding of the present invention. However, it will be apparent that the invention may be practiced without these specific details. In other instances, well-known processing structures have not been described in detail in order to avoid unnecessarily obscuring the present invention.

In addition, although the invention has been described with reference to specific embodiments thereof, it will be evident that various modifications and changes may be made thereto without departing from the broader spirit and scope of the invention. The specification and drawings are, accordingly, to be regarded in an illustrative rather than a restrictive sense.

What is claimed is:

1. A method of forming a contact in a contact hole of an insulating layer on an integrated circuit substrate, the contact hole having a contact hole bottom and a contact hole sidewall, the method comprising the steps of:

forming a thin conductive layer on the contact hole bottom and on the contact hole sidewall; and serially performing a first physical vapor deposition, a chemical vapor deposition and a second physical vapor deposition to form a glue layer on the thin conductive layer.

2. The semiconductor device of claim 1, wherein the conformal barrier layer has a thickness of about 500 Å to about 3000 Å.

3. The semiconductor device of claim 1, wherein the conformal barrier layer has a thickness of about 750 Å to about 2000 Å.

4. The semiconductor device of claim 1, wherein the planarized dielectric layer comprises a silicone oxide derived from silane or tetraethyl orthosilicate (TEOS).

5. The semiconductor device of claim 4, wherein the planarized dielectric layer has a thickness of about 12,000 Å to about 20,000 Å.

6. The semiconductor device of claim 5, wherein the planarized dielectric layer has an upper surface having peak to valley planarity less than about 2000 Å.

7. A method of manufacturing the semiconductor device recited in claim 1, the method comprising:

forming the patterned metal layer having one or more gaps;

forming the conformal barrier layer comprising silicon oxynitride on and completely covering the patterned metal layer;

forming the high-density plasma (HDP) oxide layer on the conformal barrier layer; and forming the dielectric layer on the HDP oxide layer.

8. The method as recited in claim 7, further comprising planarizing the dielectric layer.

9. The method as recited in claim 8, further comprising planarizing the dielectric layer to expose the HDP oxide layer and provide a substantially flat upper surface.

10. The method as recited in claim 8, further comprising planarizing the dielectric layer to provide a substantially flat upper surface with a peak to valley variation of less than of about 2000 Å.

11. The method as recited on claim 7, further comprising forming the conformal barrier layer at a thickness of about 500 Å to about 3000 Å.

12. The method as recited in claim 7, further comprising forming the conformal silicon oxynitride barrier layer at a thichness of about 750 Å to about 2000 Å.

13. The method as recited in claim 7, wherein the dielectric layer comprises an oxide derived from silane or tetraethyl orthosilicate (TEOS).

14. The method as recited in claim 13, comprising forming the dielectric layer at a thickness of about 20,000 Å to about 19,000 Å.

* * * * *